US012593478B2

(12) United States Patent
Kubouchi

(10) Patent No.: US 12,593,478 B2
(45) Date of Patent: Mar. 31, 2026

(54) SEMICONDUCTOR DEVICE

(71) Applicant: FUJI ELECTRIC CO., LTD.,
Kawasaki (JP)

(72) Inventor: Motoyoshi Kubouchi, Matsumoto-city
(JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 383 days.

(21) Appl. No.: 18/172,339

(22) Filed: Feb. 22, 2023

(65) Prior Publication Data

US 2023/0197772 A1 Jun. 22, 2023

Related U.S. Application Data

(63) Continuation of application No.
PCT/JP2022/012322, filed on Mar. 17, 2022.

(30) Foreign Application Priority Data

Mar. 17, 2021 (JP) ................................. 2021-044157

(51) Int. Cl.
*H10D 62/10* (2025.01)
*H10D 12/00* (2025.01)

(52) U.S. Cl.
CPC ......... *H10D 62/102* (2025.01); *H10D 12/481*
(2025.01)

(58) Field of Classification Search
CPC .... H10D 62/102; H10D 12/481; H10D 8/422;
H10D 62/129; H10D 62/53; H10D 62/60;
(Continued)

(56) References Cited

U.S. PATENT DOCUMENTS

2003/0003692 A1 1/2003 Suzuki
2005/0116249 A1 6/2005 Mauder
(Continued)

FOREIGN PATENT DOCUMENTS

DE 112019000094 T5 9/2020
JP 2002368001 A 12/2002
(Continued)

OTHER PUBLICATIONS

International Search Report and (ISA/237) Written Opinion of the
International Search Authority for International Patent Application
No. PCT/JP2022/012322, mailed by the Japan Patent Office on Jun.
7, 2022.

(Continued)

*Primary Examiner* — Mohammad A Rahman

(57) ABSTRACT

Provided is a semiconductor device including: a semicon-
ductor substrate having bulk donors distributed throughout
the semiconductor substrate; a high-concentration hydrogen
peak provided on the semiconductor substrate and having a
hydrogen dose amount of $3 \times 10^{15}/cm^2$ or more; a high-
concentration region including a position overlapping with
the high-concentration hydrogen peak in a depth direction of
the semiconductor substrate and having a donor concentra-
tion higher than a bulk donor concentration; and a lifetime
adjustment portion provided at a position overlapping with
the high-concentration hydrogen peak in the depth direction
and having a carrier lifetime indicating a minimum value.

20 Claims, 11 Drawing Sheets

HYDROGEN ION
100

(58) Field of Classification Search

CPC ............... H10D 64/117; H01L 21/263; H01L 21/26506; H01L 21/26513; H01L 21/3221; H01L 21/265; H01L 21/322; H01L 21/336; H01L 29/78; H01L 29/06; H01L 29/739; H01L 29/861; H01L 29/868; H01L 29/78658; H01L 29/78657; H01L 29/78652; H01L 29/06301; H01L 29/78655; H01L 29/78653; H01L 29/786521; H01L 29/91

See application file for complete search history.

(56)          References Cited

U.S. PATENT DOCUMENTS

| | | | |
|---|---|---|---|
| 2014/0217463 | A1 | 8/2014 | Schulze |
| 2015/0024556 | A1 | 1/2015 | Miyazaki |
| 2015/0311279 | A1 | 10/2015 | Onozawa |
| 2016/0276470 | A1 | 9/2016 | Kenta |
| 2017/0271447 | A1* | 9/2017 | Tamura .................. H10D 62/60 |
| 2020/0194562 | A1 | 6/2020 | Yoshimura |
| 2021/0082702 | A1* | 3/2021 | Agata .................. H10D 64/112 |

FOREIGN PATENT DOCUMENTS

| | | |
|---|---|---|
| JP | 2015095559 A | 5/2015 |
| WO | 2013147275 A1 | 10/2013 |
| WO | 2014208404 A1 | 12/2014 |
| WO | 2016204227 A1 | 12/2016 |
| WO | 2020080295 A1 | 4/2020 |

OTHER PUBLICATIONS

Office Action issued for counterpart German Application 112022000087. 2, issued by the German Patent and Trademark Office on Jan. 15, 2025.

* cited by examiner

100

SEMICONDUCTOR DEVICE

The contents of the following Japanese patent application (s) are incorporated herein by reference:
NO. 2021-044157 filed in JP on Mar. 17, 2021
NO. PCT/JP2022/012322 filed in WO on Mar. 17, 2022

BACKGROUND

1. Technical Field

The present invention relates to a semiconductor device.

2. Related Art

Conventionally, a technique is known in which protons are implanted into a semiconductor substrate to form a buffer region, and helium is implanted into the semiconductor substrate to adjust a carrier lifetime (see, for example, Patent Document 1).

Patent Document 1: U.S. Patent Application Publication No. 2014/217463

DESCRIPTION OF EXEMPLARY EMBODIMENTS

Figure 1:
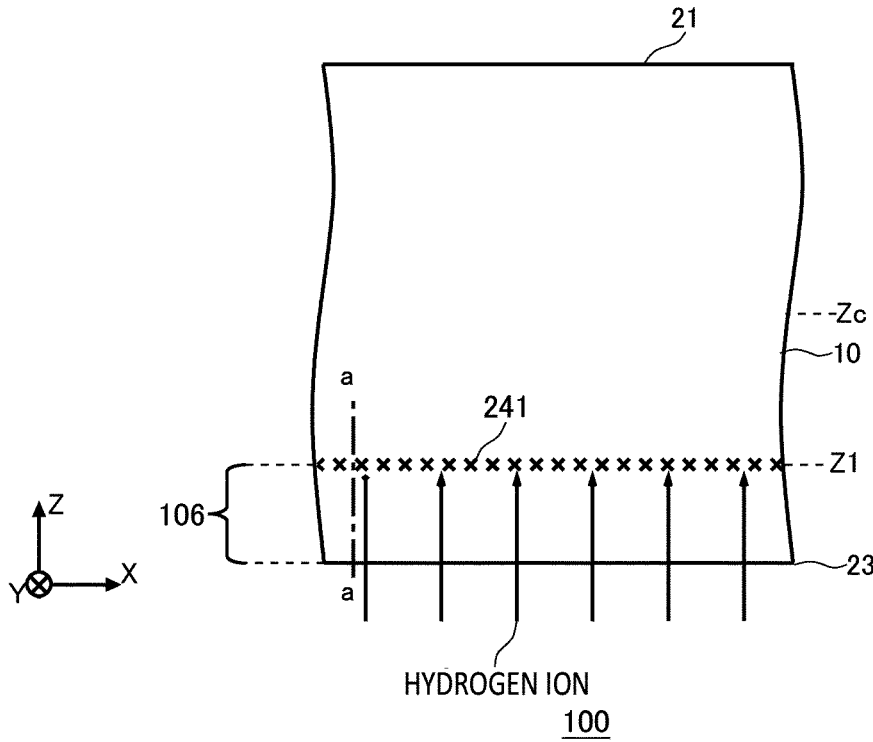
FIG. 1 is a cross-sectional view illustrating an example of a semiconductor device 100.

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, the axis perpendicular to the upper surface and the lower surface of the semiconductor substrate is defined as the Z axis. In the present specification, the direction of the Z axis may be referred to as the depth direction. In addition, in the present specification, a direction parallel to the upper surface and the lower surface of the semiconductor substrate, including the X axis and the Y axis, may be referred to as a horizontal direction. In the case of referring to an upper surface side of the semiconductor substrate in the present specification, the upper surface side indicates a region from the center to the upper surface in the depth direction of the semiconductor substrate. In the case of referring to a lower surface side of the semiconductor substrate, the lower surface side indicates a region from the center to the lower surface in the depth direction of the semiconductor substrate.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. In addition, in the present specification, a description of a P++ type or an N++ type means a higher doping concentration than that of the P+ type or the N+ type.

A chemical concentration in the present specification indicates an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV profiling). In addition, a carrier density measured by a spreading resistance profiling method (SRP method) may be used as the net doping concentration. It may be assumed that the carrier density measured by the CV method or the SRP method is a value in a thermal equilibrium state. In addition, in a region of the N type, the donor concentration is sufficiently higher than the acceptor concentration, and thus the carrier density in the region may be used as the donor concentration. Similarly, in a region of the P type, the carrier density of the region may be used as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/cm$^3$ or/cm$^3$ is used to indicate a concentration per unit volume. This unit is used for a concentration of a donor or an acceptor in a semiconductor substrate, or a chemical concentration. A notation of atoms may be omitted. In the present specification, a unit system is the SI base unit system unless otherwise particularly noted. Although a unit of length is represented using cm, it may be converted to meters (m) before calculations.

The carrier density measured by the SRP method may be lower than the concentration of the donor or the acceptor. In a range where a current flows when a spreading resistance is measured, carrier mobility of the semiconductor substrate may be lower than a value in a crystalline state. The decrease in carrier mobility occurs when carriers are scattered due to the disturbance (disorder) of a crystal structure due to a lattice defect or the like.

The concentration of the donor or the acceptor calculated from the carrier density measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 is a cross-sectional view illustrating an example of a semiconductor device 100. The semiconductor device 100 includes the semiconductor substrate 10. The semiconductor substrate 10 is a substrate that is formed of a semiconductor material. As an example, the semiconductor substrate 10 is a silicon substrate.

At least one of a transistor element such as an insulated gate bipolar transistor (IGBT) and a diode element such as a freewheeling diode (FWD) is formed on the semiconductor substrate 10. In FIG. 1, each electrode of the transistor element and the diode element and each region, which is provided inside the semiconductor substrate 10, of the transistor element and the diode element are omitted.

In the semiconductor substrate 10 of this example, bulk donors of the N type are distributed throughout. The bulk donor is a dopant donor substantially uniformly contained in an ingot during manufacturing of the ingot from which the semiconductor substrate 10 is made. The bulk donor of this example is an element other than hydrogen. The bulk donor dopant is, for example, an element of group V or group VI, and is, for example, phosphorous, antimony, arsenic, selenium, or sulfur, but the invention is not limited to these. The bulk donor of this example is phosphorous. The bulk donor is also contained in a region of the P type. The semiconductor substrate 10 may be a wafer cut out from a semiconductor ingot, or may be a chip obtained by singulating the wafer. The semiconductor ingot may be manufactured by either a Czochralski method (CZ method), a magnetic field applied Czochralski method (MCZ method), or a float zone method (FZ method).

An oxygen chemical concentration contained in the substrate manufactured by the MCZ method is, as an example, $1\times10^{17}$ to $7\times10^{17}$ atoms/cm$^3$. The oxygen chemical concentration contained in the substrate manufactured by the FZ method is, as an example, $1\times10^{15}$ to $5\times10^{16}$ atoms/cm$^3$. The bulk donor concentration may use a chemical concentration of bulk donors distributed throughout the semiconductor substrate 10, or may be a value between 90% and 100% of the chemical concentration. In the semiconductor substrate doped with dopants, such as phosphorous, of group V and group VI, the bulk donor concentration may be $1\times10^{11}$/cm$^3$ or more and $3\times10^{13}$/cm$^3$ or less. The bulk donor concentration of the semiconductor substrate doped with the dopants of group V and group VI is preferably $1\times10^{12}$/cm$^3$ or more and $1\times10^{13}$/cm$^3$ or less. Further, as the semiconductor substrate 10, a non-doped substrate substantially not containing a bulk dopant such as phosphorous may be used. In that case, the bulk donor concentration ($N_{B0}$) of the non-doped substrate is, for example, from $1\times10^{10}$/cm$^3$ or more and to $5\times10^{12}$/cm$^3$ or less. The bulk donor concentration ($N_{B0}$) of the non-doped substrate is preferably $1\times10^{11}$/cm$^3$ or more. The bulk donor concentration ($N_{B0}$) of the non-doped substrate is preferably $5\times10^{12}$/cm$^3$ or less.

The semiconductor substrate 10 has an upper surface 21 and a lower surface 23. The upper surface 21 and the lower surface 23 are two principal surfaces of the semiconductor substrate 10. In the present specification, an orthogonal axis in a plane parallel to the upper surface 21 and the lower surface 23 is defined as an X axis and a Y axis, and an axis perpendicular to the upper surface 21 and the lower surface 23 is defined as a Z axis. The gate structure of the transistor portion may not be provided in the upper surface 21. The gate structure is a structure including a gate metal layer (for example, a gate conductive portion 44 described below) and a gate dielectric film (for example, a gate dielectric film 42 described below).

In the semiconductor substrate 10, hydrogen ions are implanted to a predetermined depth position Z1 from the lower surface 23. The principal surface of the semiconductor substrate 10 into which hydrogen ions are implanted may not be limited to the lower surface 23 and may be the upper surface 21. In the present specification, the distance in the Z axis direction from the lower surface 23 may be referred to as a depth position. In the present specification, the center position in the depth direction of the semiconductor substrate 10 is defined as a depth position Zc. The depth position Z1 is a position where the distance in the Z axis direction from the lower surface 23 is Z1. The depth position Z1 of this example is arranged on the lower surface 23 side of the semiconductor substrate 10 (a region between the depth position Zc and the lower surface 23). The implantation of hydrogen ions to the depth position Z1 means that the average distance (also referred to as a range) by which the hydrogen ions pass through the interior of the semiconductor substrate 10 is Z1. The hydrogen ions are accelerated by an acceleration energy corresponding to the predetermined depth position Z1 to be introduced to the interior of the semiconductor substrate 10.

It is assumed that a region, through which hydrogen ions have passed, in the interior of the semiconductor substrate 10 is a passed-through region 106. In the example of FIG. 1, a region from the lower surface 23 of the semiconductor substrate 10 to the depth position Z1 is the passed-through region 106. Some of hydrogen ions pass through the semiconductor substrate 10 up to the upper surface 21 side relative to the depth position Z1. It may be assumed that a region through which hydrogen ions with a predetermined concentration have passed is the passed-through region 106. For example, the predetermined concentration may be a half value of the chemical concentration of hydrogens implanted to the depth position Z1. In this case, the passed-through region 106 includes a region on the upper surface 21 side relative to the depth position Z1, by a half width of the hydrogen chemical concentration distribution. Hydrogen ions may be implanted to the entire surface of the semiconductor substrate 10 on the XY plane, or may be implanted to only a partial region. In this example, hydrogen ions are implanted to the entire surface of the semiconductor substrate 10.

In the passed-through region 106, through which hydrogen ions are passed, in the semiconductor substrate 10, lattice defects mainly composed of vacancies such as monatomic vacancies (V) and divacancies (VV) are formed. Atoms adjacent to the vacancies have dangling bonds. The lattice defects also include interstitial atoms, dislocations, and the like, and may include donors and acceptors in a broad sense. However, in the present specification, the lattice defects mainly composed of vacancies may be referred to as vacancy-type lattice defects, vacancy-type defects, or simply lattice defects. The lattice defect mainly composed of the vacancy may function as a recombination center of electrons and hole carriers. Further, since a large number of lattice defects are formed due to the implantation of hydrogen ions into the semiconductor substrate 10, the crystallinity of the semiconductor substrate 10 may be strongly disturbed. In the present specification, this disturbance of crystallinity may be referred to as disorder.

In addition, oxygen is contained in the entire semiconductor substrate 10. The oxygen is introduced intentionally or unintentionally during manufacturing a semiconductor ingot. In addition, by implanting hydrogen ions, hydrogen is contained in a passed-through region 106. In addition, by performing heat treatment (which may be referred to as annealing in the present specification) on the semiconductor substrate 10 after the hydrogen ions are implanted, hydrogen ions diffuse to the passed-through region 106. In this example, hydrogen is distributed throughout the passed-through region 106.

After the hydrogen ions are implanted to the semiconductor substrate 10, hydrogen (H), a vacancy (V), and oxygen (O) are combined to form a VOH defect inside the semiconductor substrate 10. In addition, by performing the annealing on the semiconductor substrate 10, hydrogen diffuses, thus facilitating the formation of the VOH defect. In addition, since hydrogen can be combined to a vacancy by performing the annealing after forming the passed-through region 106, the release of hydrogen from the lower surface 23 to the outside of the semiconductor substrate 10 can be suppressed.

The VOH defect functions as a donor that supplies electrons. In the present specification, the VOH defect may simply be referred to as a hydrogen donor or a donor. In the semiconductor substrate 10 of this example, the hydrogen donor is formed in the passed-through region 106. The doping concentration of the hydrogen donor at each position is lower than the chemical concentration of hydrogen at each position. Regarding the chemical concentration of hydrogen, the ratio of the doping concentration of hydrogen donors (VOH defects) to the chemical concentration of hydrogen may be a value between 0.1% and 30% (that is, 0.001 or more and 0.3 or less). In this example, the ratio of the doping concentration of hydrogen donors (VOH defects) to the chemical concentration of hydrogen is 1% to 5%. It should be noted that unless otherwise stated, in the present specification, both VOH defects which have a distribution similar to a chemical concentration distribution of hydrogen and VOH defects which are similar to a distribution of the vacancy defects in the passed-through region 106 are referred to as a hydrogen donor or hydrogen as a donor.

By forming a hydrogen donor in the passed-through region 106 of the semiconductor substrate 10, the donor concentration in the passed-through region 106 can be made higher than the doping concentration of the bulk donor (also referred to simply as bulk donor concentration in some cases) of the bulk donor. This allows a local region of the N type to be easily formed. In addition, by setting the range of hydrogen ions large, the passed-through region 106 is allowed to be large in the Z axis direction. In this case, a high-concentration region having a higher donor concentration than the bulk donor can be formed in a wider range. Normally, it is necessary to prepare the semiconductor substrate 10 having a predetermined bulk donor concentration in accordance with characteristics of an element to be formed on the semiconductor substrate 10, particularly a rated voltage or a breakdown voltage. Meanwhile, when the passed-through region 106 is formed in a large portion, the donor concentration of the semiconductor substrate 10 can be adjusted by controlling the dose amount of hydrogen ions. Thus, the semiconductor device 100 can be manufactured using a semiconductor substrate having a bulk donor concentration that does not correspond to the characteristics and the like of the element. The variation in the bulk donor concentration at the time of manufacturing the semiconductor substrate 10 is relatively large, but the dose amount of the hydrogen ions can be controlled with relatively high accuracy. Thus, the concentration of lattice defects generated by implanting hydrogen ions can also be controlled with high accuracy, and the donor concentration of the passed-through region can be controlled with high accuracy.

The depth position Z1 may be arranged in a range of half or less of the thickness of the semiconductor substrate 10, or may be arranged in a range of ¼ or less of the thickness of the semiconductor substrate 10 with respect to the lower surface 23. The depth position Z1 may be arranged in a range of half or less of the thickness of the semiconductor substrate 10, or may be arranged in a range of ¼ or less of the thickness of the semiconductor substrate 10 with respect to the upper surface 21.

Immediately after hydrogen ions are implanted, a large number of lattice defects are formed in the vicinity of the depth position Z1. On the other hand, a large amount of hydrogen exists in the vicinity of the depth position Z1. When the semiconductor substrate 10 is annealed, the lattice defects are combined to the hydrogen to form hydrogen donors. Thus, in general, most of lattice defects in the vicinity of the depth position Z1 become hydrogen donors, and lattice defects hardly remain in the vicinity of the depth position Z1.

On the other hand, when the dose amount of hydrogen ions exceeds a certain value, a phenomenon has been confirmed in which a large number of lattice defects are considered to remain in the vicinity of the depth position Z1 even when the semiconductor substrate 10 is annealed. This can be presumed to be because when the dose amount of hydrogen ions exceeds the certain value, the crystallinity of the semiconductor substrate 10 in the vicinity of the depth position Z1 is disturbed to such an extent that the crystal-linity cannot be recovered by annealing.

In a region where a large number of lattice defects remain, carriers are captured by the lattice defects, so that the lifetime of the carriers is shortened. By adjusting the lifetime of the carrier, characteristics such as the turn-off time of the semiconductor device 100 can be adjusted. In this example, by setting the dose amount of hydrogen ions with respect to the depth position Z1 to a certain value or more, a lifetime adjustment portion 241 can be formed at the depth position Z1 and a high-concentration region having a higher concen-tration than the bulk donor can be formed in the passed-through region 106 with a simple manufacturing process.

Figure 2:
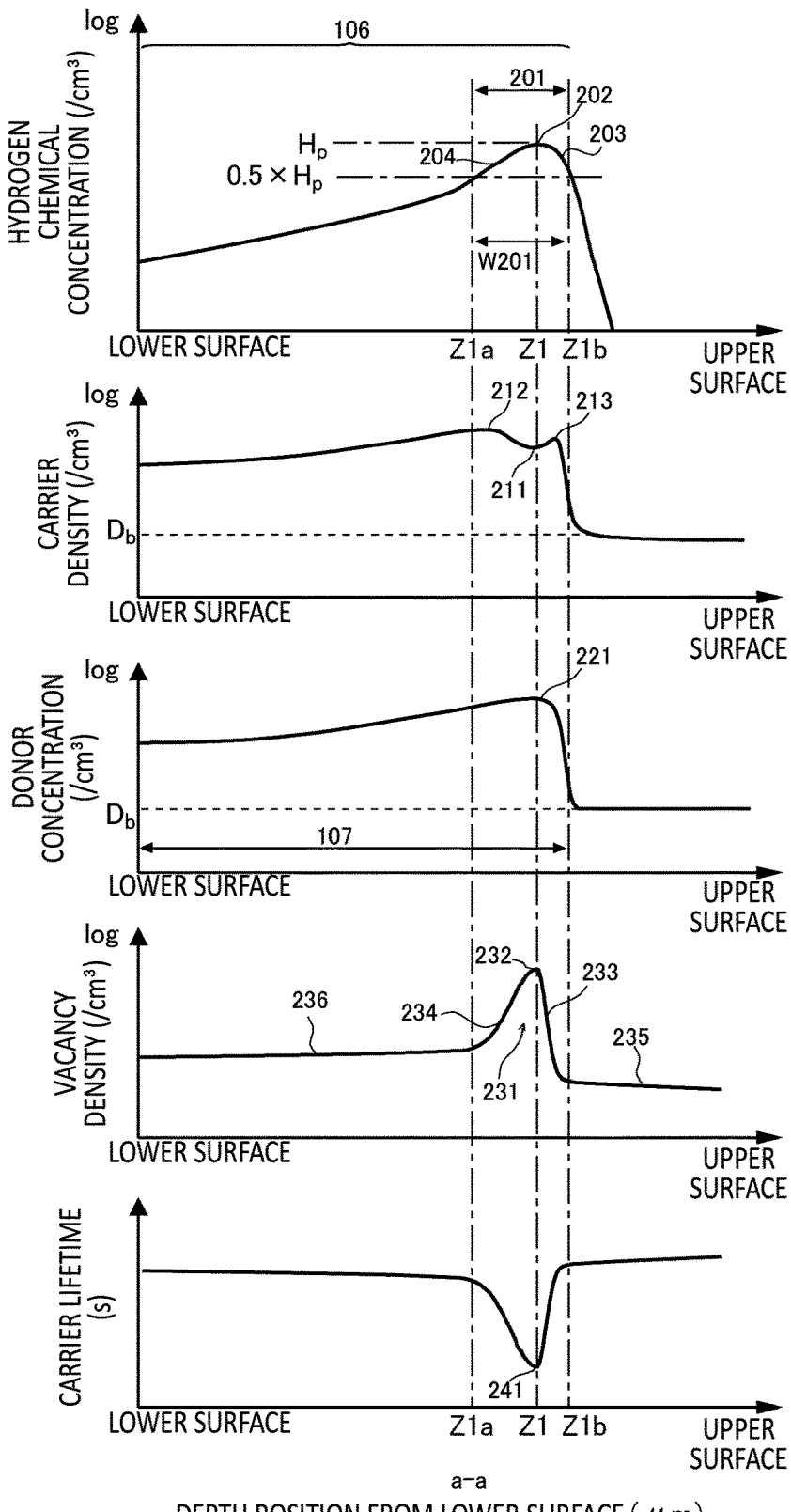
FIG. 2 illustrates a distribution example of a hydrogen chemical concentration, a carrier density, a donor concentration, a vacancy density, and a carrier lifetime in a depth direction at a position indicated by line a-a in FIG. 1.

FIG. 2 illustrates a distribution example of the hydrogen chemical concentration, the carrier density, the donor con-centration, the vacancy density, and the carrier lifetime in the depth direction at the position indicated by line a-a in FIG. 1. The donor concentration in a high-concentration region 107 in this example is the concentration of hydrogen donors. FIG. 2 illustrates each distribution after hydrogen ions are implanted into the depth position Z1 and annealing is performed.

In FIG. 2, a horizontal axis represents the depth position from the lower surface 23, and a vertical axis represents the chemical concentration or density per unit volume on a logarithmic axis. Note that the vertical axis in the graph of the carrier lifetime represents time (seconds). The chemical concentration in FIG. 2 is measured by, for example, a SIMS method. The carrier density is measured by, for example, the SRP method. In FIG. 2, a bulk donor concentration $D_b$ is indicated by a broken line. The bulk donor concentration $D_b$ may be uniform throughout the semiconductor substrate 10. The semiconductor substrate 10 of this example is an MCZ substrate as an example.

A high-concentration hydrogen peak 201 is provided at the depth position Z1 of the semiconductor substrate 10. The high-concentration hydrogen peak 201 is a peak of the hydrogen chemical concentration distribution in the depth direction. The high-concentration hydrogen peak 201 has a local maximum 202, an upper tail 203, and a lower tail 204. The local maximum 202 is a point at which the hydrogen chemical concentration exhibits a maximum value. A depth position of the local maximum 202 is Z1. The lower tail 204 is a slope in which the hydrogen chemical concentration monotonously decreases from the local maximum 202 toward the lower surface 23 of the semiconductor substrate 10. The upper tail 203 is a slope in which the hydrogen chemical concentration monotonously decreases from the local maximum 202 toward the upper surface 21 of the semiconductor substrate 10. In this example, since hydrogen ions have been implanted from the lower surface 23, a relatively large number of hydrogen ions exist between the local maximum 202 and the lower surface 23. The hydrogen chemical concentration of the upper tail 203 may decrease more steeply than the hydrogen chemical concentration of the lower tail 204.

In this example, hydrogen ions are implanted at a dose amount of $1 \times 10^{16}$ ions/cm' from the lower surface 23 to the depth position Z1. Note that as the dose amount of the peak of impurities such as hydrogen, a value may be used which is obtained by integrating the chemical concentration of the impurities in the range of the full width at half maximum of the peak in the depth direction. Alternatively, a value obtained by multiplying the peak concentration of the peak by the full width at half maximum may be used as the dose amount of the peak of impurities such as hydrogen. On the other hand, in the peak, the width of the range in the depth direction where the peak concentration is a concentration of 10% or more is defined as 10% of the full width. As the dose amount of the peak of impurities of such as hydrogen, a value may be used which is obtained by integrating the chemical concentration of the impurities in the range of 10% full width of the peak in the depth direction. In the example of FIG. 2, a value obtained by integrating the hydrogen chemical concentration in the range of a full width at half maximum W201 of the high-concentration hydrogen peak 201 may be set as the hydrogen dose amount of the high-concentration hydrogen peak 201. In the example of FIG. 2, it is assumed that the lower end position of the full width at half maximum W201 is Z1a, and the upper end position of the full width at half maximum W201 is Z1b.

Hydrogen donors are formed in the passed-through region 106 by implanting hydrogen ions into the semiconductor substrate 10 and performing annealing. As a result, the high-concentration region 107 having a donor concentration higher than the bulk donor concentration $D_b$ is formed in the passed-through region 106. The high-concentration region 107 includes a position overlapping with the high-concen-tration hydrogen peak 201 in the depth direction of the semiconductor substrate 10. That is, the high-concentration region 107 includes at least a part of the range of the full width at half maximum W201 of the high-concentration hydrogen peak 201. The high-concentration region 107 may be provided from the lower surface 23 to the upper end position Z1b of the high-concentration hydrogen peak 201. In the high-concentration region 107, the donor concentra-tion distribution may have a shape corresponding to the hydrogen chemical concentration distribution. For example, the donor concentration distribution may have a donor concentration peak 221 at a position overlapping with the high-concentration hydrogen peak 201.

When hydrogen ions are implanted at a high dose amount into the depth position Z1, vacancies remain in the vicinity of the depth position Z1 even after annealing. The vacancy density distribution in this example has a vacancy density peak 231 at the depth position Z1. The vacancy density peak 231 has a local maximum 232. The local maximum 232 is a point at which the vacancy density exhibits a maximum value.

The vacancy density peak 231 is arranged to overlap with the high-concentration hydrogen peak 201. The overlapping of peaks means that the local maximum of one peak is arranged within a range of the full width at half maximum of the other peak. In this example, the local maximum 232 of the vacancy density peak 231 is arranged within the range of the full width at half maximum W201 of the high-concentration hydrogen peak 201. The local maximum 232 may be arranged at the depth position Z1.

In the region where the vacancy density peak 231 is arranged, the frequency at which carriers are trapped in the vacancies is high, and thus the carrier lifetime is shortened. As a result, the lifetime adjustment portion 241 in which the carrier lifetime indicates a minimum value is provided at the position overlapping with the high-concentration hydrogen peak 201. The lifetime adjustment portion 241 may be provided at the depth position Z1.

The carrier density has a distribution similar to the donor concentration. Note that the carrier lifetime in the vicinity of the depth position Z1 is short, and the mobility of the carrier is smaller than the value in the crystal. Therefore, the carrier density in the vicinity of the depth position Z1 is lower than the donor concentration. The carrier density distribution in this example has a valley 211 arranged at a position overlapping with the high-concentration hydrogen peak 201, and a peak 212 and a peak 213 arranged adjacent to the valley 211. The valley 211 is a portion where the carrier density exhibits a minimum value, and the peak 212 and the peak 213 are portions where the carrier density exhibits a maximum value.

The valley 211, the peak 212, and the peak 213 in this example are arranged within the range of the full width at half maximum W201 of the high-concentration hydrogen peak 201. The valley 211 may be arranged between the peaks 212 and 213. The peak 212 is arranged closer to the lower surface 23 than the valley 211, and the peak 213 is arranged closer to the upper surface 21 than the valley 211. The carrier density at the local maximum of the peak 212 may be higher than the carrier density at the local maximum of the peak 213.

When the carrier density distribution has the valley 211 within the range of the full width at half maximum W201 of the high-concentration hydrogen peak 201, it can be estimated that the lifetime adjustment portion 241 is provided at the position of the valley 211. In addition, when the vacancy density peak 231 exists within the range of the full width at half maximum W201 of the high-concentration hydrogen peak 201, it may be estimated that the lifetime adjustment portion 241 is provided at the position of the vacancy density peak 231.

The donor concentration distribution in this example shows no minimum value at the position of the valleys 211. The donor concentration may monotonically increase from the lower end position Z1a of the high-concentration hydrogen peak 201 toward the depth position Z1. Increasing monotonically means that there is no region where the donor concentration decreases from the lower end position Z1a toward the depth position Z1.

The vacancy density distribution has an upper tail 233 and a lower tail 234. The lower tail 234 is a slope in which the vacancy density decreases from the local maximum 232 toward the lower surface 23 of the semiconductor substrate 10. The upper tail 233 is a slope in which the vacancy density decreases from the local maximum 232 toward the upper surface 21 of the semiconductor substrate 10. The vacancy density of the upper tail 233 may decrease more steeply than the vacancy density of the lower tail 234.

The vacancy density distribution includes a lower flat portion 236 arranged closer to the lower surface 23 of the semiconductor substrate 10 than the vacancy density peak 231 and an upper flat portion 235 arranged closer to the upper surface 21 of the semiconductor substrate 10 than the vacancy density peak 231. Each flat portion is a region where the vacancy density is substantially constant in the depth direction. Being substantially constant means, for example, a state in which the variation range of the vacancy density is within ±50%. The upper flat portion 235 may have a lower vacancy density than the lower flat portion 236. As the vacancy density of the flat portion, an average value may be used. The full width at half maximum (in this example, the full width at half maximum of the vacancy density peak 231) of the vacancy density distribution may be smaller than the full width at half maximum (in this example, the full width at half maximum W201 of the high-concentration hydrogen peak 201) of the hydrogen chemical concentration distribution. The full width at half maximum of the carrier lifetime distribution may be smaller than the full width at half maximum of the hydrogen chemical concentration distribution.

In this example, the region closer to the lower surface 23 than the depth position Z1 has a higher vacancy density than the region closer to the upper surface 21 than the depth position Z1. When the high-concentration region 107 is applied to a buffer region described below, a depletion layer spreads from the upper surface 21 side. By arranging the region having a high vacancy density on the lower surface 23 side, it is possible to suppress the depletion layer from spreading to the region having a high vacancy density, and to reduce the leakage current.

Figure 3:
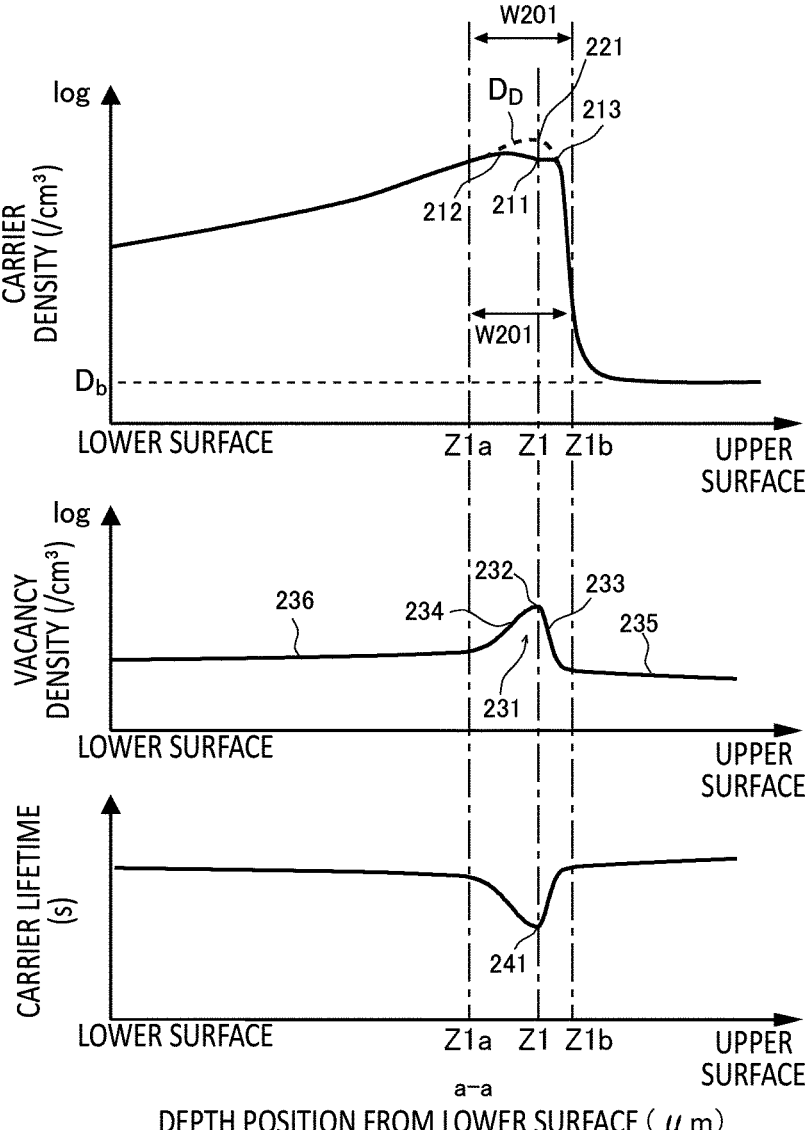
FIG. 3 illustrates another distribution example of the carrier density, the vacancy density, and the carrier lifetime at the position indicated by line a-a in FIG. 1.

FIG. 3 illustrates another distribution example of the carrier density, the vacancy density, and the carrier lifetime at the position indicated by line a-a in FIG. 1. In this example, hydrogen ions are implanted at a dose amount of $3 \times 10^{15}$ ions/cm' from the lower surface 23 to the depth position Z1. Other structures or manufacturing processes are similar to the example of FIG. 2. The shapes of the hydrogen chemical concentration distribution and the donor concentration distribution are similar to those in the example of FIG. 2. Note that the peak values of the hydrogen chemical concentration and the donor concentration are different depending on the dose amount of hydrogen. The shape of the donor concentration distribution in the vicinity of the depth position Z1 is different from the carrier density distribution illustrated in FIG. 3. The distribution of a donor concentration $D_D$ in the vicinity of the depth position Z1 is indicated by a broken line in the graph of the carrier density distribution. The same applies to the other drawings.

Also in this example, the carrier density distribution has the valley 211, the peak 212, and the peak 213 in the range of the full width at half maximum W201 of the high-concentration hydrogen peak 201. Thus, it can be seen that the lifetime adjustment portion 241 in which the carrier lifetime indicates the minimum value and the vacancy density peak 231 are arranged at the position of the valley 211.

The carrier density distribution may have a kink in the vicinity of the depth position Z1 instead of the valley 211. The kink is a portion in which a differential value obtained by differentiating the carrier density in the depth direction indicates a minimum value.

In addition, the depth position of the peak 212 or the peak 213 in the carrier density distribution is different from the depth position Z1 of the local maximum 202 of the high-concentration hydrogen peak 201. That is, due to the presence of the vacancy density peak 231, the valley 211 appears in the carrier density in the vicinity of the depth position Z1, and the position of the local maximum of the carrier density changes. The depth position of the peak 212 or the peak 213 may be different from the depth position of the local maximum of the donor concentration peak 221. This also shows that the lifetime adjustment portion 241 and the vacancy density peak 231 are arranged in the vicinity of the depth position Z1.

In addition, the full width at half maximum centered on the peak 212 of the carrier density distribution may be larger than the full width at half maximum of the donor concentration peak 221. That is, the peak of the carrier density in the vicinity of the depth position Z1 may be crushed due to the presence of the vacancy density peak 231. This also shows that the lifetime adjustment portion 241 and the vacancy density peak 231 are arranged in the vicinity of the depth position Z1. In addition, the carrier densities at the local maximums of the peak 212 and the peak 213 may be lower than the donor concentration at the local maximum of the donor concentration peak 221.

Figure 4:
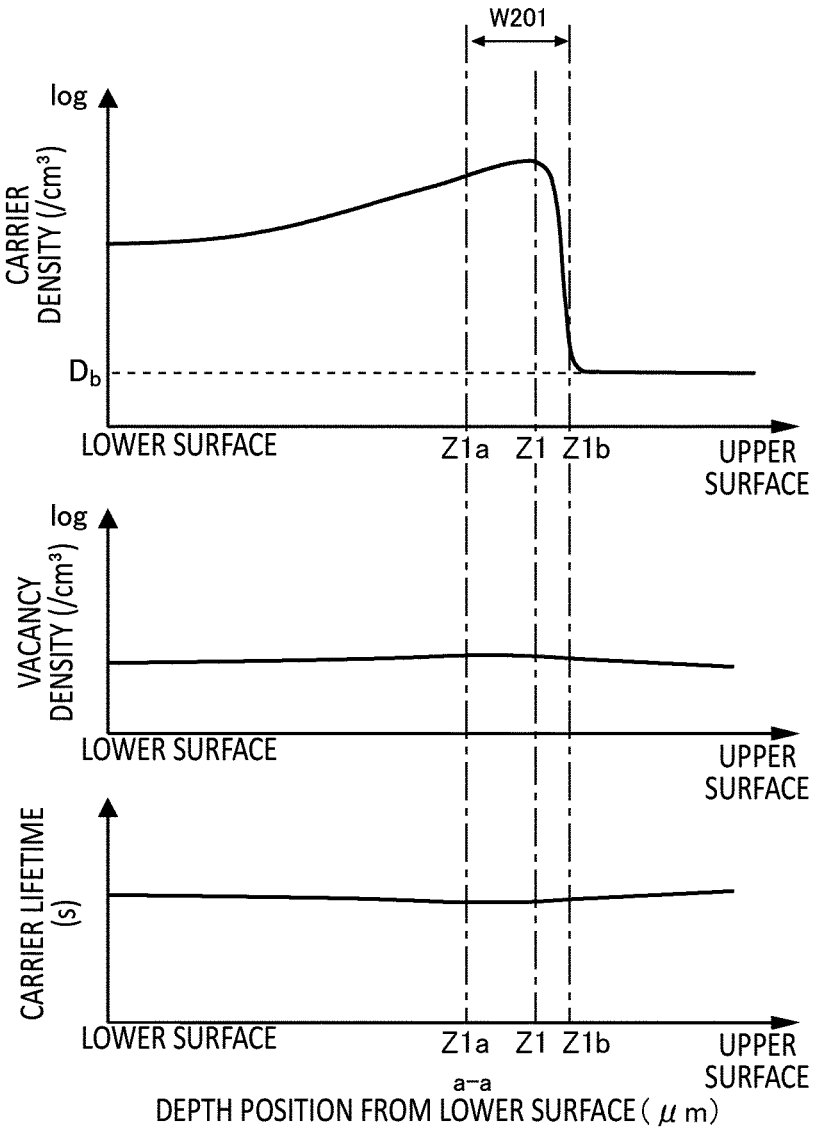
FIG. 4 illustrates a distribution of the carrier density, the vacancy density, and the carrier lifetime according to a comparative example.

FIG. 4 illustrates distributions of the carrier density, the vacancy density, and the carrier lifetime according to a comparative example. In this example, hydrogen ions are implanted at a dose amount of $1 \times 10^{15}$ ions/cm$^2$ from the lower surface 23 to the depth position Z1. Other structures or manufacturing processes are similar to the example of FIG. 2. The shapes of the hydrogen chemical concentration distribution and the donor concentration distribution are similar to those in the example of FIG. 2, and thus are omitted in FIG. 4. Note that the peak values of the hydrogen chemical concentration and the donor concentration are different depending on the dose amount of hydrogen.

The carrier density distribution in this example has no valley 211 or kink in the range of the full width at half maximum W201 of the hydrogen peak. The carrier density distribution in this example is substantially equivalent to the donor concentration distribution. In addition, a clear peak of the vacancy density does not appear at the depth position Z1, and the carrier lifetime does not have a clear minimum value. That is, in the dose amount of this example, the lifetime adjustment portion 241 is not formed at the depth position Z1. This can be presumed to be because the dose amount of hydrogen ions is small, so that the disturbance of the crystallinity of the semiconductor substrate 10 can be recovered by annealing. A vacancy density peak formed by implantation of hydrogen ions is combined to hydrogen by annealing, and most of the vacancy density peak becomes a hydrogen donor.

As described with reference to FIGS. 2 to 4, by setting the dose amount of hydrogen ions of the high-concentration hydrogen peak 201 to $3 \times 10^{15}$ ions/cm$^2$ or more and $3 \times 10^{16}$ ions/cm$^2$ or less, the high-concentration region 107 and the lifetime adjustment portion 241 can be formed in a common manufacturing process. The dose amount of hydrogen ions at the high-concentration hydrogen peak 201 may be $1 \times 10^{16}$ ions/cm$^2$ or more, or $3 \times 10^{16}$ ions/cm$^2$ or more. In addition, a hydrogen chemical concentration H$_p$ at the local maximum 202 of the high-concentration hydrogen peak 201 may be $2 \times 10^{18}$ atoms/cm$^3$ or more and $2 \times 10^{19}$ atoms/cm$^3$ or less. The hydrogen chemical concentration H$_p$ may be $7 \times 10^{18}$ atoms/cm$^3$ or more, or $2 \times 10^{19}$ atoms/cm$^3$ or more.

Figure 5:
FIG. 5 is an example of a top view of the semiconductor device 100.

FIG. 5 is an example of a top view of the semiconductor device 100. FIG. 5 illustrates a position at which each member is projected on an upper surface of a semiconductor substrate 10. FIG. 5 illustrates merely some members of the semiconductor device 100, and omits illustrations of some members.

The semiconductor device 100 includes the semiconductor substrate 10 described with reference to FIGS. 1 to 4. The semiconductor substrate 10 has an end side 102 in the top view. When merely referred to as the top view in the present view, it means that the semiconductor substrate 10 is viewed from an upper surface side. The semiconductor substrate 10 of this example has two sets of end sides 102 opposite to each other in the top view. In FIG. 5, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 5.

The active portion 160 is provided with at least one of a transistor portion 70 including a transistor element such as an IGBT, and a diode portion 80 including a diode element such as a freewheeling diode (FWD). In the example of FIG. 5, the transistor portion 70 and the diode portion 80 are arranged alternately along a predetermined array direction (the X axis direction in this example) on the upper surface of the semiconductor substrate 10. The active portion 160 in another example may be provided with only one of the transistor portion 70 and the diode portion 80.

In FIG. 5, a region where each of the transistor portions 70 is arranged is indicated by a symbol "T", and a region where each of the diode portions 80 is arranged is indicated by a symbol F. In the present specification, a direction perpendicular to the array direction in the top view may be referred to as an extending direction (the Y axis direction in FIG. 5). Each of the transistor portions 70 and the diode portions 80 may have a longitudinal length in the extending direction. That is, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described below may be the same.

Each of the diode portions 80 includes a cathode region of the N+ type in a region in contact with the lower surface of the semiconductor substrate 10. In the present specification, a region where the cathode region is provided is referred to as the diode portion 80. That is, the diode portion 80 is a region that overlaps with the cathode region in the top view. On the lower surface of the semiconductor substrate 10, a collector region of the P+ type may be provided in a region other than the cathode region. In the present specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 112. The semiconductor device 100 may have a pad such as an anode pad, a cathode pad, and a current detection pad. Each pad is arranged in a region close to the end side 102. The region close to the end side 102 indicates a region between the end side 102 and the emitter electrode in the top view. When the semiconductor device 100 is mounted, each pad may be connected to an external circuit via a wiring such as a wire.

A gate potential is applied to the gate pad 112. The gate pad 112 is electrically connected to a conductive portion of a gate trench portion of the active portion 160. The semiconductor device 100 includes a gate runner that connects the gate pad 112 and the gate trench portion. In FIG. 5, the gate runner is hatched with diagonal lines.

The gate runner of this example has an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 112. The outer circumferential gate runner 130 is arranged above the semiconductor substrate 10. The outer circumferential gate runner 130 may be a metal wiring including aluminum or the like.

The active-side gate runner 131 is provided in the active portion 160. Providing the active-side gate runner 131 in the active portion 160 can reduce a variation in wiring length from the gate pad 112 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not illustrated) that is a PN junction diode formed of polysilicon or the like, and a current detection portion (not illustrated) that simulates an operation of the transistor portion provided in the active portion 160.

The semiconductor device 100 of this example includes an edge termination structure portion 90 between the active portion 160 and the end side 102 in the top view. The edge termination structure portion 90 of this example is arranged between the outer circumferential gate runner 130 and the end side 102. The edge termination structure portion 90 reduces an electric field strength on the upper surface side of the semiconductor substrate 10. The edge termination structure portion 90 includes a plurality of guard rings 92. The guard ring 92 is a region of the P type in contact with the upper surface of the semiconductor substrate 10. The guard ring 92 may enclose the active portion 160 in the top view. The plurality of guard rings 92 are arranged at predetermined intervals between the outer circumferential gate runner 130 and the end side 102. The guard ring 92 arranged on an outside may enclose the guard ring 92 arranged on the inner side by one. The outside indicates a side closer to the end side 102, and the inside indicates a side closer to the outer circumferential gate runner 130. By providing the plurality of guard rings 92, a depletion layer on the upper surface side of the active portion 160 can be extended outward, and the breakdown voltage of the semiconductor device 100 can be improved. The edge termination structure portion 90 may further include at least one of a guard ring, a field plate, and a RESURF which are annularly provided to enclose the active portion 160.

Figure 6:
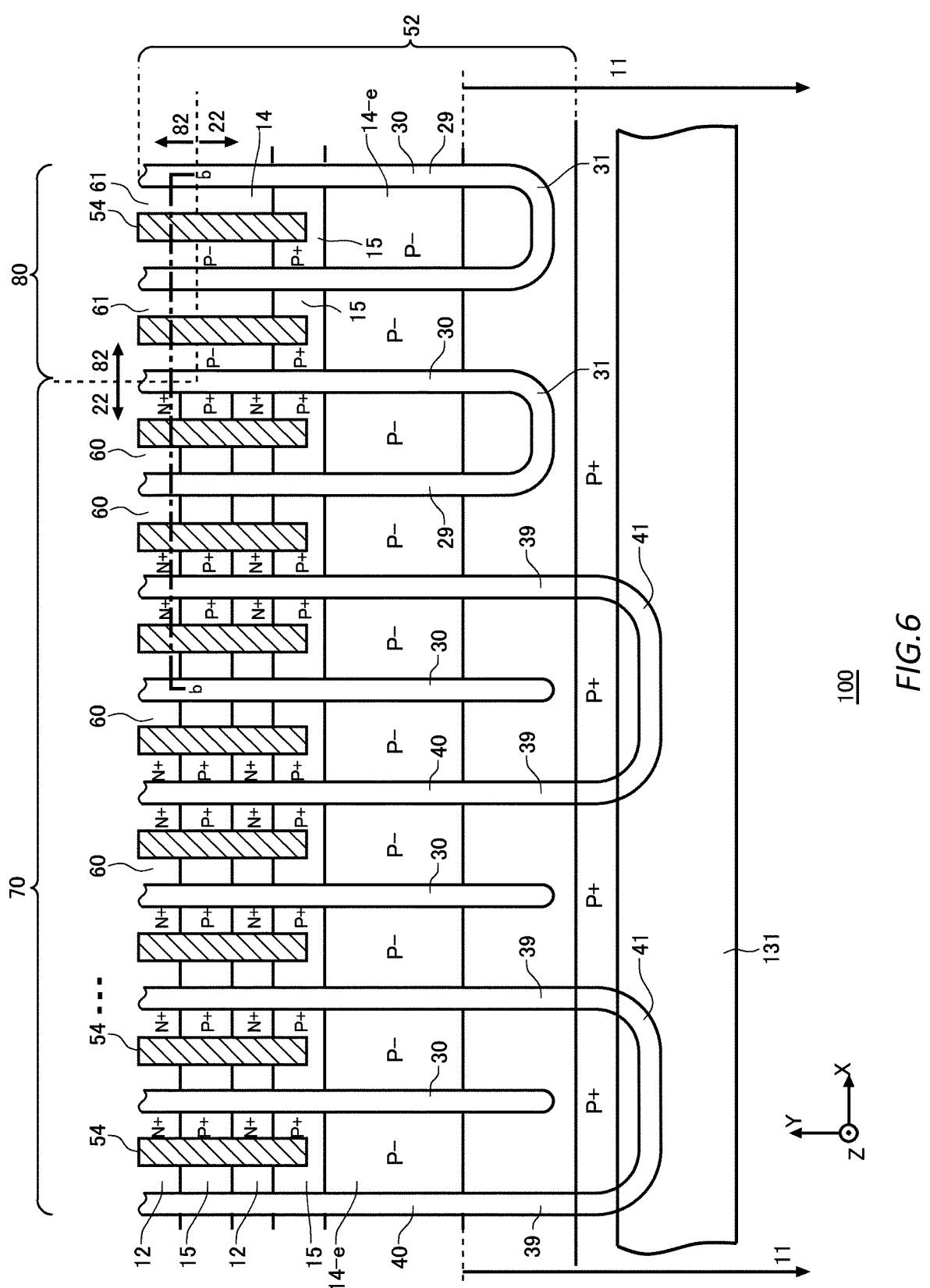
FIG. 6 is an enlarged view of a region E in FIG. 5.

FIG. 6 is an enlarged view of a region E in FIG. 5. The region E is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but the interlayer dielectric film is omitted in FIG. 6. In the interlayer dielectric film of this example, a contact hole 54 is provided passing through the interlayer dielectric film. In FIG. 6, each of the contact holes 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 6 illustrates a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided to overlap with the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is the P– type, and the well region 11 is the P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 6 is the Y axis direction.

At least a part of the edge portion 41 is preferably provided in a curved shape in a top view. Connecting between end portions of the two linear portions 39 in the Y axis direction by the edge portion 41 can reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 illustrated in FIG. 6 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. That is, the bottom in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion indicates a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 6 illustrates the base region 14-e arranged at one end portion of each mesa portion in the extending direction, the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is the N+ type, and the contact region 15 is the P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region adjacent to the lower surface of the semiconductor substrate 10. On the lower surface of the semiconductor substrate 10, a collector region of the P+ type 22 may be provided in a region where the cathode region 82 is not provided. In FIG. 6, a boundary between the cathode region 82 and the collector region 22 is indicated by a dotted line.

The cathode region 82 is arranged away from the well region 11 in the Y axis direction. With this configuration, the distance between the region of the P type (well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 7:
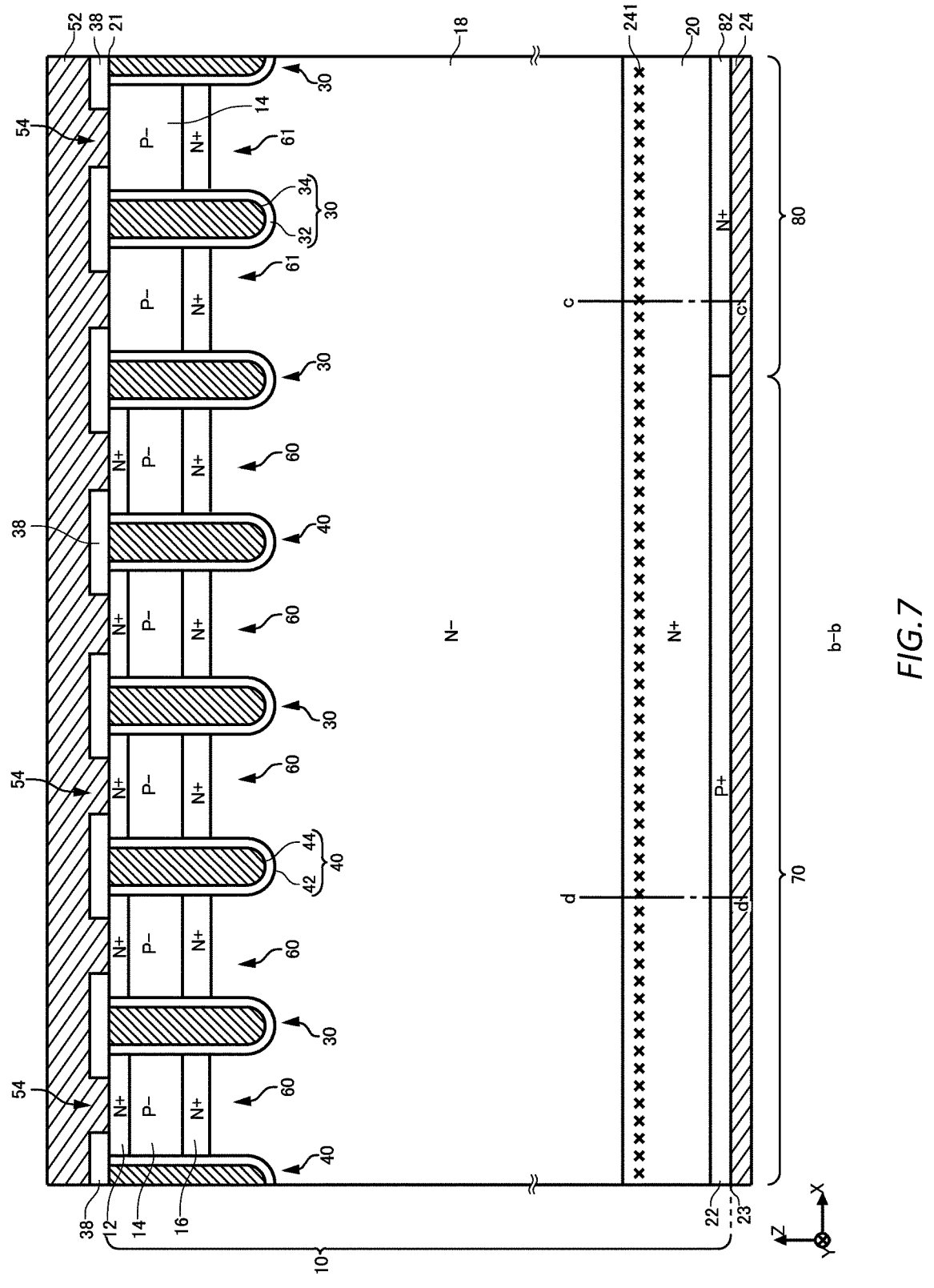
FIG. 7 is a view illustrating an example of a b-b cross section in FIG. 6.

FIG. 7 is a view illustrating an example of a b-b cross section in FIG. 6. The b-b cross section is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section. The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact holes 54 described in FIG. 6.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

The semiconductor substrate 10 includes a drift region 18 of the N type. The doping concentration of the drift region 18 may be same as the bulk donor concentration. In another example, the doping concentration of the drift region 18 may be higher than the bulk donor concentration. The drift region 18 is provided in each of the transistor portion 70 and the diode portion 80.

In the mesa portion 60 of the transistor portion 70, the emitter region 12 of the N+ type and the base region 14 of the P– type are provided in order from an upper surface 21 side of the semiconductor substrate 10. The drift region 18 is provided below the base region 14. The mesa portion 60 may be provided with an accumulation region 16 of the N+ type. The accumulation region 16 is arranged between the base region 14 and the drift region 18.

The emitter region 12 is exposed on the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than that of the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is a region of the N+ type with a higher doping concentration than the drift region 18. By providing the accumulation region 16 having the high concentration between the drift region 18 and the base region 14, it is possible to improve a carrier injection enhancement effect (IE effect) and reduce an on-state (saturation) voltage. The accumulation region 16 may be provided to cover the entire lower surface of the base region 14 in each mesa portion 60.

The mesa portion 61 of the diode portion 80 is provided with the base region 14 of the P-type in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, a buffer region 20 of the N+ type may be provided on the lower surface 23 side of the drift region 18. The doping concentration of the buffer region 20 is higher than the doping concentration of the drift region 18. The buffer region 20 has one or more donor concentration peaks having donor concentrations higher than that of the drift region 18. The buffer region 20 may function as a field stopper layer which prevents a depletion layer expanding from the lower end of the base region 14 from reaching the collector region of the P+ type 22 and the cathode region 82 of the N+ type.

In this example, the depth position Z1 described in FIGS. 1 to 3 is included in the buffer region 20 on the lower surface 23 side of the semiconductor substrate 10. That is, the high-concentration hydrogen peak 201, the peak 212, the valley 211, the peak 213, the donor concentration peak 221, the vacancy density peak 231, and the lifetime adjustment portion 241 are included in the buffer region 20. As described above, the high-concentration hydrogen peak 201, the peak 212, the valley 211, the peak 213, the donor concentration peak 221, the vacancy density peak 231, and the lifetime adjustment portion 241 may be provided on the entire XY plane of the semiconductor substrate 10 or may be provided on a part thereof. In this example, the high-concentration hydrogen peak 201, the peak 212, the valley 211, the peak 213, the donor concentration peak 221, the vacancy density peak 231, and the lifetime adjustment portion 241 are provided in both the transistor portion 70 and the diode portion 80.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches the drift region 18. In a region where at least any one of the emitter region 12, the contact region 15, and the accumulation region 16 is provided, each trench portion also passes through the doping regions of these to reach the drift region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, the gate dielectric film 42, and the gate conductive portion 44. The gate trench portion 40 is an example of a gate structure. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad (not illustrated) connected to an external circuit different from the gate pad, and control different from that of the gate conductive portion 44 may be performed. Further, the dummy conductive portion 34 may be electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved-line shape in the cross section) convexly downward.

Figure 8:
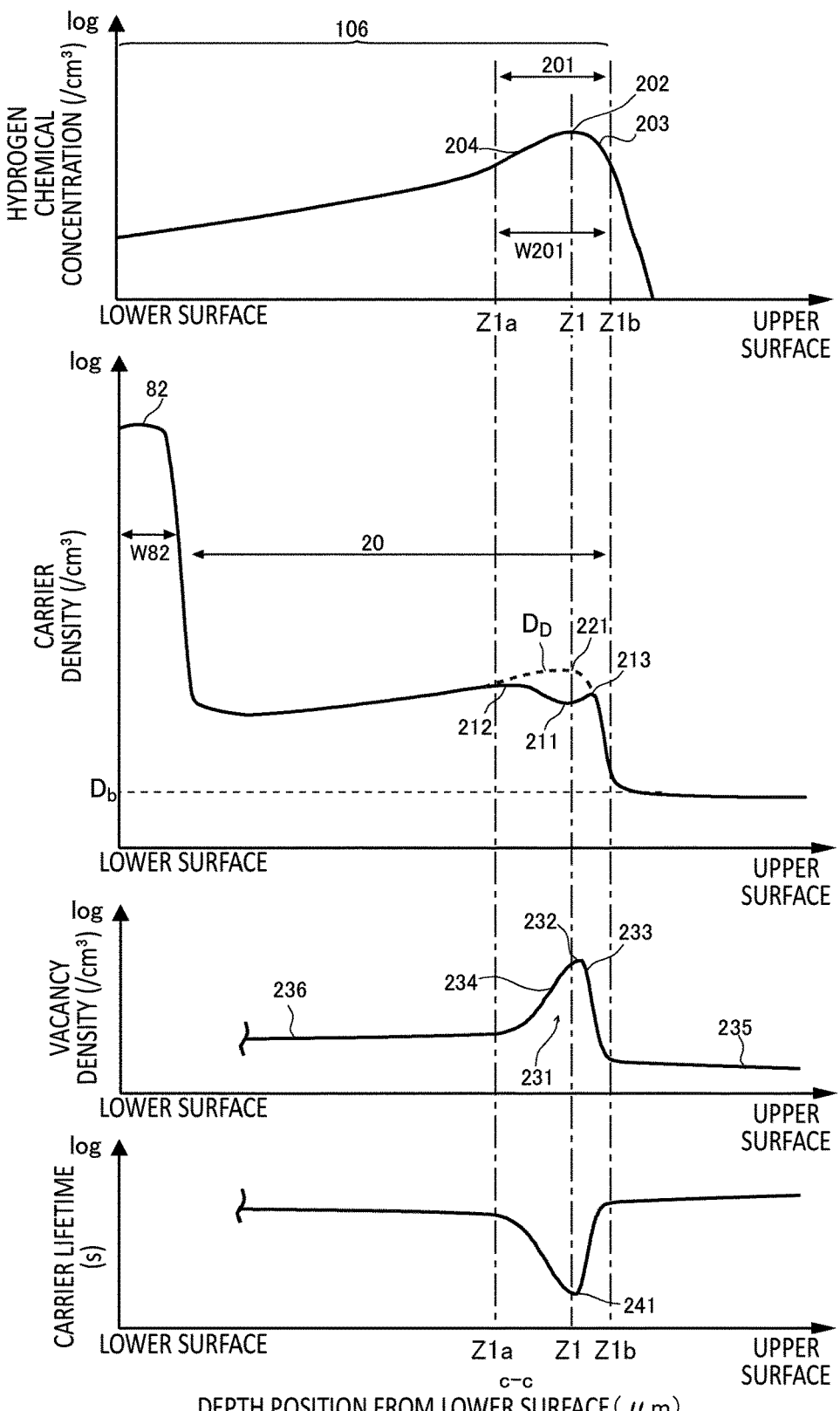
FIG. 8 illustrates a distribution example of the hydrogen chemical concentration, the carrier density, the vacancy density, and the carrier lifetime in the depth direction at a position indicated by line c-c in FIG. 7.

FIG. 8 illustrates a distribution example of the hydrogen chemical concentration, the carrier density, the vacancy density, and the carrier lifetime in the depth direction at a position indicated by line c-c in FIG. 7. In this example, hydrogen ions are implanted at a dose amount of $1 \times 10^{16}$ ions/cm$^2$ into the depth position Z1. The hydrogen chemical concentration distribution, the donor concentration distribution, the vacancy density distribution, and the carrier lifetime distribution in the buffer region 20 are similar to those in the example of FIG. 2. The buffer region 20 of this example has a single donor concentration peak 221 as illustrated in FIG. 2. The buffer region 20 of another example may have a plurality of donor concentration peaks 221.

The carrier density distribution in this example has a donor concentration peak in the cathode region 82. The donor in the cathode region 82 may be a donor, such as phosphorus, other than a hydrogen donor. According to this example, the formation of the high-concentration buffer region 20 and the formation of the lifetime adjustment portion 241 can be performed in a common process.

Figure 9:
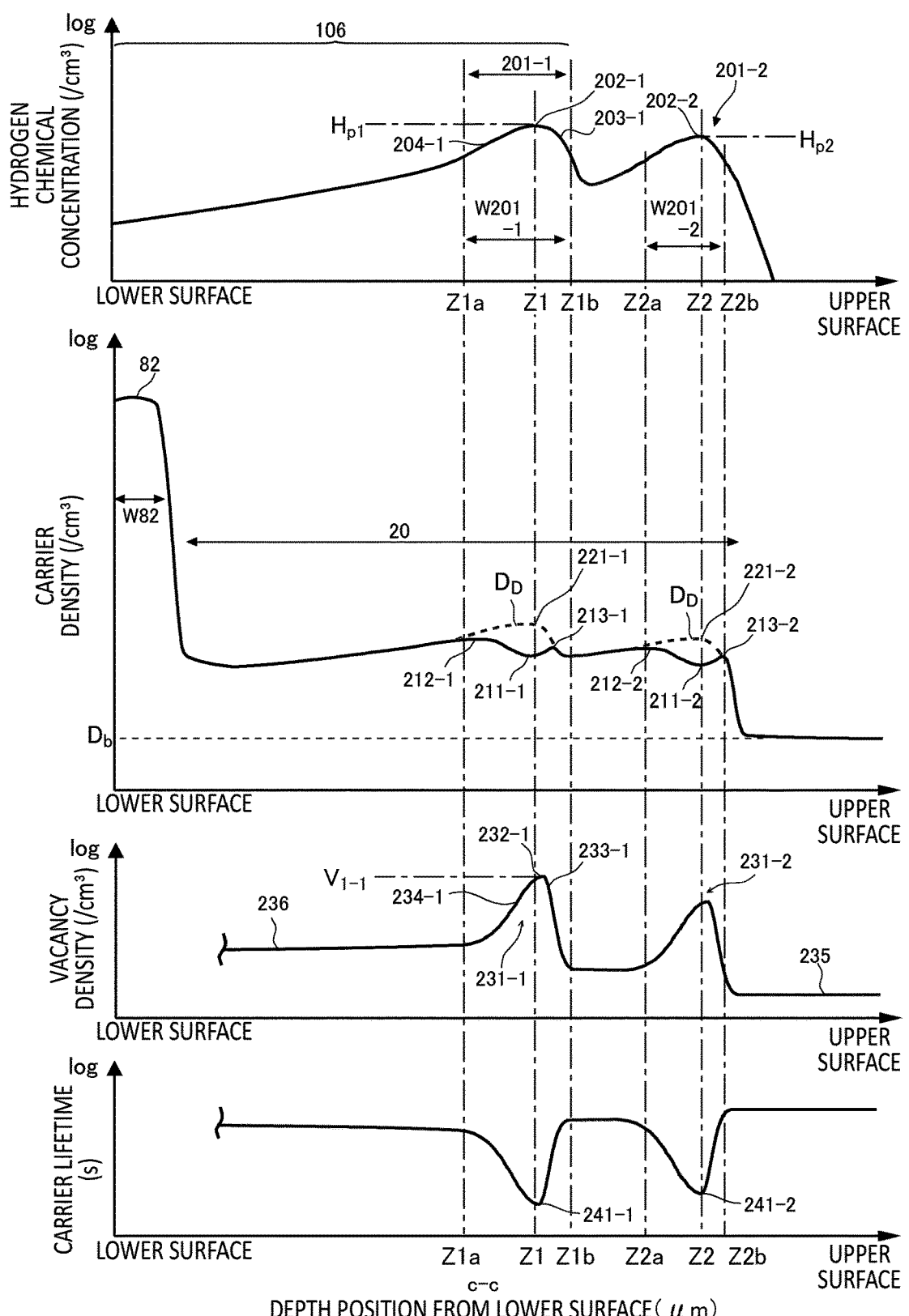
FIG. 9 illustrates another distribution example of the hydrogen chemical concentration, the carrier density, the vacancy density, and the carrier lifetime in line c-c.

FIG. 9 illustrates another distribution example of the hydrogen chemical concentration, the carrier density, the vacancy density, and the carrier lifetime in line c-c. In this example, the high-concentration hydrogen peak 201 is formed at each of a plurality of depth positions (the depth position Z1 and the depth position Z2 in FIG. 9). That is, hydrogen ions are implanted at a dose amount of $3 \times 10^{15}$ ions/cm' or more into each of the plurality of depth positions. The annealing of the semiconductor substrate 10 may be performed collectively after hydrogen ions are implanted into the plurality of depth positions, or may be performed every time hydrogen ions are implanted into each depth position.

In this example, the lifetime adjustment portion 241 is formed at both the depth position Z1 and the depth position Z2. According to this example, the plurality of lifetime adjustment portions 241 can be easily formed. The hydrogen dose amounts for the plurality of depth positions may be the same or different. In this example, two high-concentration hydrogen peaks 201-1 and 202-2 are both arranged in the buffer region 20. In another example, at least one high-concentration hydrogen peak 201 may be provided in a region other than the buffer region 20. For example, at least one high-concentration hydrogen peak 201 may be arranged in a region on the upper surface 21 side of the semiconductor substrate 10. In the high-concentration hydrogen peak 201 arranged on the upper surface 21 side, hydrogen ions may be implanted from the upper surface 21, and hydrogen ions may be implanted from the lower surface 23. Also in this case, the high-concentration region 107 is formed from the high-concentration hydrogen peak to the implantation surface of hydrogen ions.

Figure 10:
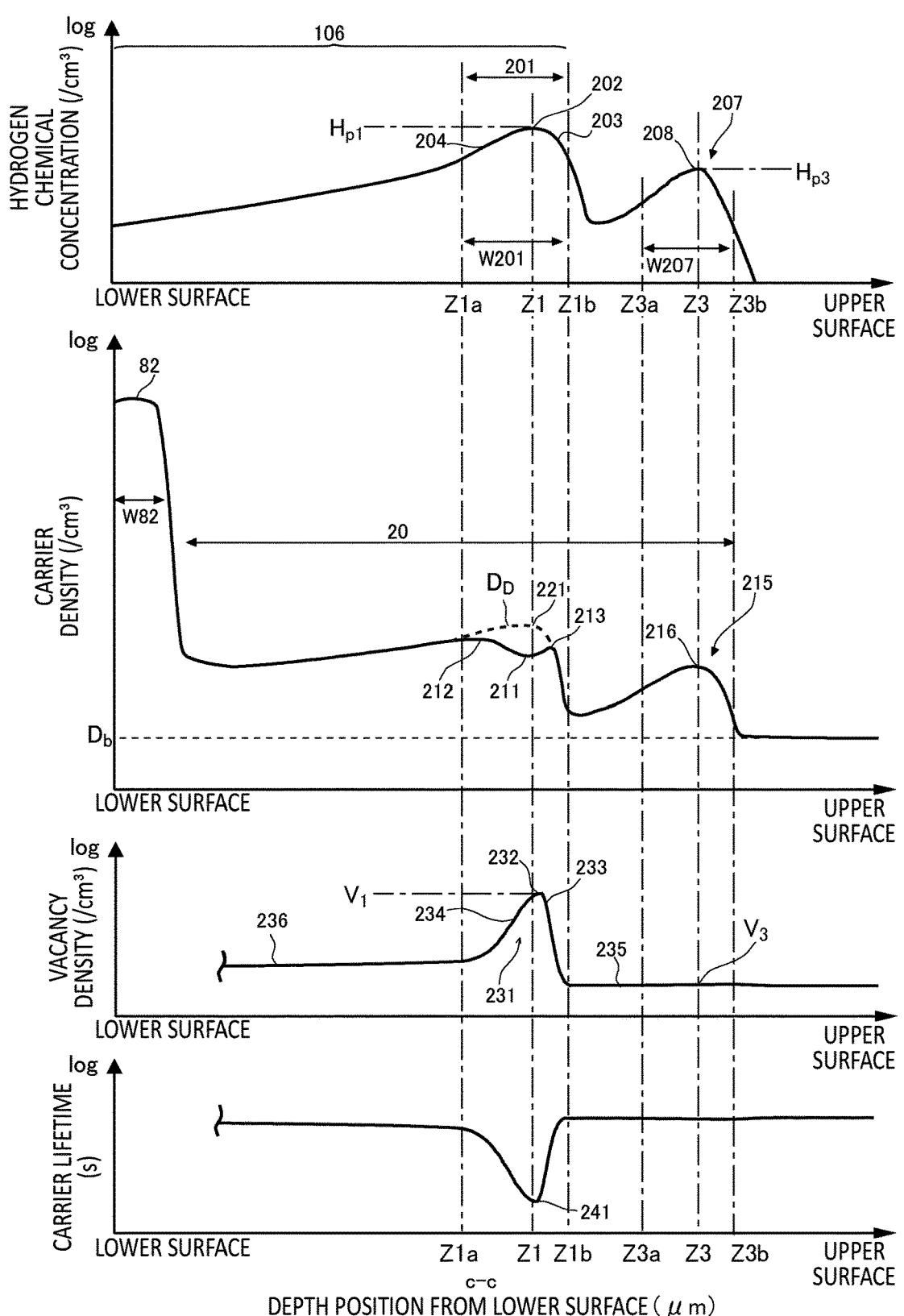
FIG. 10 illustrates another distribution example of the hydrogen chemical concentration, the carrier density, the vacancy density, and the carrier lifetime in line c-c.

FIG. 10 illustrates another distribution example of the hydrogen chemical concentration, the carrier density, the vacancy density, and the carrier lifetime in line c-c. Note that the donor concentration distribution is similar to the carrier density distribution except for the vicinity of the depth position Z1. The distribution of the donor concentration $D_D$ in the vicinity of the depth position Z1 is indicated by a broken line.

The semiconductor device 100 of this example has a low-concentration hydrogen peak 207 arranged closer to the upper surface 21 of the semiconductor substrate 10 than the high-concentration hydrogen peak 201. The low-concentration hydrogen peak 207 has a local maximum 208 at a depth position Z3. The dose amount of hydrogen ions with respect to the depth position Z3 is smaller than $3\times10^{15}$ ions/cm$^2$. The dose amount of hydrogen ions with respect to the depth position Z3 may be $1\times10^{13}$ ions/cm$^2$ or more and $1\times10^{15}$ ions/cm$^2$ or less.

Since hydrogen ions are implanted into the depth position Z3, an upper surface side donor peak 215 in which the donor concentration exhibits a peak is formed at the depth position Z3. In FIG. 10, the upper surface side donor peak 215 is indicated by a solid line in the graph of the carrier density distribution. The carrier density distribution may have a peak of the same shape at the same position as the upper surface side donor peak 215. The low-concentration hydrogen peak 207 is provided at a position overlapping with the upper surface side donor peak 215. The depth position of the local maximum 208 of the low-concentration hydrogen peak 207 and the depth position of the local maximum 216 of the upper surface side donor peak 215 may be same as each other.

Since the hydrogen dose amount with respect to the depth position Z3 is low, almost all the vacancy defects formed in the vicinity of the depth position Z3 are terminated with hydrogen and become hydrogen donors. Thus, in the range of a full width at half maximum W207 in the depth direction of the low-concentration hydrogen peak 207, the vacancy density distribution does not have a clear peak, and the carrier lifetime distribution does not have a clear minimum value.

Within the range of the full width at half maximum W207, the vacancy density distribution may have a minute peak. Note that, the vacancy density in the range of the full width at half maximum W201 is sufficiently smaller than the vacancy density peak 231 provided in the range of the full width at half maximum W207. As an example, the vacancy density at the depth position Z1 is $V_1$, and the vacancy density at the depth position Z3 is $V_3$. The hydrogen chemical concentration at the local maximum 208 of the low-concentration hydrogen peak 207 is $H_{p3}$.

A ratio $(V_3/H_{p3})$ of a vacancy density $V_3$ to the concentration $H_{p3}$ of the low-concentration hydrogen peak 207 at the depth position Z3 is defined as $R_3$. A ratio $(V_1/H_{p1})$ of a vacancy density $V_1$ to the concentration $H_{p1}$ of the high-concentration hydrogen peak 201 at the depth position Z1 is set to $R_1$. The ratio $R_3$ is smaller than the ratio $R_1$. The ratio $R_3$ may be $1/10$ or less or $1/100$ or less of the ratio $R_1$.

In addition, the range of the full width at half maximum W201 of the high-concentration hydrogen peak 201 and the range of the full width at half maximum W207 of the low-concentration hydrogen peak 207 are preferably separated from each other. That is, a lower end position Z3$a$ of the full width at half maximum W207 is preferably arranged closer to the upper surface 21 than the upper end position Z1$b$ of the full width at half maximum W201. As a result, for example, when hydrogen ions are implanted into the depth position Z1, it is possible to suppress prevent the crystallinity of the semiconductor substrate 10 at the depth position Z3 from being greatly disturbed. Thus, at the depth position Z3, the lattice defect is terminated with hydrogen to easily form a hydrogen donor. A distance between the lower end position Z3$a$ and the upper end position Z1$b$ may be larger than half of the full width at half maximum W201 or larger than the full width at half maximum W201.

According to this example, the buffer region 20 long in the depth direction can be formed by implanting hydrogen ions into a plurality of depth positions. In addition, the lifetime adjustment portion 241 can be easily formed in the buffer region 20. In addition, since the upper surface side donor peak 215 is provided on the upper surface 21 side of the lifetime adjustment portion 241, it is possible to suppress the depletion layer from reaching the lifetime adjustment portion 241.

The donor concentration at the local maximum 216 of the upper surface side donor peak 215 is lower than the donor concentration at the local maximum of the donor concentration peak 221. The donor concentration at the local maximum 216 may be larger or smaller than the donor concentration at the peak 212. The donor concentration at the local maximum 216 may be larger or smaller than the donor concentration at the peak 213. The donor concentration at the local maximum 216 may be larger or smaller than the donor concentration at the valley 211.

In the present specification, an integrated value obtained by integrating the donor concentration from the lower end of the gate trench portion 40 toward the lower surface 23 of the semiconductor substrate 10 is referred to as an integrated concentration. The semiconductor substrate 10 has a critical depth position where the integrated concentration reaches a critical integrated concentration. A critical integrated concentration $n_c$ is expressed by, for example, the following formula.

$$n_c = \varepsilon_s \times E_c/q$$

where $\varepsilon_s$ is the dielectric constant of a material forming the semiconductor substrate 10, q is a charge element amount, and $E_c$ is the dielectric breakdown electric field strength of the semiconductor substrate 10. For example, when the semiconductor substrate 10 is a silicon substrate, $E_c$ is $1.8\times10^5$ to $2.5\times10^5$ (V/cm), and $n_c$ is $1.2\times10^{12}$ to $1.6\times10^{12}$ (/cm$^2$). In addition, in a case where a forward bias is applied between the collector electrode 24 and the emitter electrode 52, the maximum value of the electric field intensity reaches the dielectric breakdown electric field strength of the semiconductor substrate 10, and avalanche breakdown occurs, when depletion is caused up to a specific position of the drift region 18, a value obtained by integrating the donor concentration from the lower end of the gate trench portion 40 to the specific position corresponds to the critical integrated concentration.

The local maximum 202 of the high-concentration hydrogen peak 201 is preferably arranged closer to the lower surface 23 of the semiconductor substrate 10 than the critical depth position. As a result, even when avalanche breakdown occurs, it is possible to suppress the depletion layer from reaching the vacancy density peak 231 and to suppress the leakage current. As illustrated in FIG. 10, by providing the upper surface side donor peak 215, the critical depth position is easily arranged on the upper surface 21 side of the high-concentration hydrogen peak 201.

Figure 11:
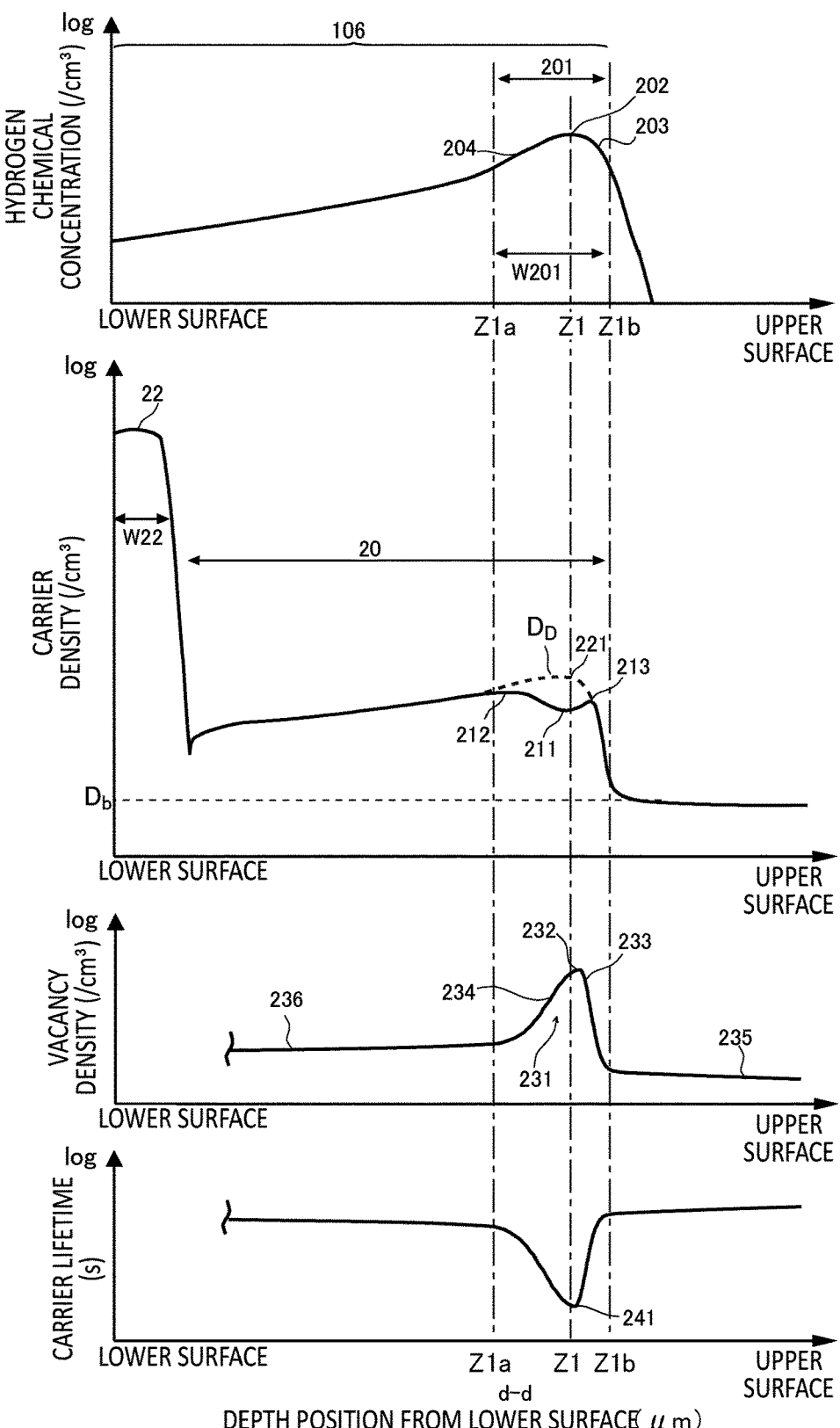
FIG. 11 illustrates a distribution example of the hydrogen chemical concentration, the carrier density, the vacancy density, and the carrier lifetime in the depth direction at a position indicated by line d-d in FIG. 7.

FIG. 11 illustrates a distribution example of the hydrogen chemical concentration, the carrier density, the vacancy density, and the carrier lifetime in the depth direction at the position indicated by line d-d in FIG. 7. In this example, the collector region 22 is provided instead of the cathode region 82 in the example illustrated in FIG. 8. Other distributions are similar to those in the example illustrated in FIG. 8.

The collector region 22 has an acceptor concentration peak as illustrated in the graph of the carrier density distribution. The full width at half maximum of the acceptor concentration peak is W22. The full width at half maximum W22 of the collector region 22 and the full width at half maximum W201 of the high-concentration hydrogen peak 201 are preferably separated from each other. A distance between the full width at half maximum W22 and the full width at half maximum W201 may be equal to or more than a half of the full width at half maximum W201, or may be equal to or more than the full width at half maximum W201.

In this example, the hydrogen dose amount of the high-concentration hydrogen peak 201 tends to increase, and the donor concentration peak 221 tends to increase. By increasing the distance between the high-concentration hydrogen peak 201 and the collector region 22, it is possible to suppress the influence of the donor concentration peak 221 on the concentration of the collector region 22.

As illustrated in FIG. 8, it is preferable that a full width at half maximum W82 of the cathode region 82 and the full width at half maximum W201 of the high-concentration hydrogen peak 201 are also separated from each other. A distance between the full width at half maximum W82 and the full width at half maximum W201 may be equal to or more than a half of the full width at half maximum W201, or may be equal to or more than the full width at half maximum W201. The distance between the full width at half maximum W82 of the cathode region 82 and the full width at half maximum W201 of the high-concentration hydrogen peak 201 may be less, equal, or more than the distance between the full width at half maximum W22 of the collector region 22 and the full width at half maximum W201 of the high-concentration hydrogen peak 201. Further, the example of FIGS. 9 and 10 is a cross section taken along line c-c in FIG. 7, but may be a cross section taken along line d-d in FIG. 7. In this case, the cathode region 82 in FIGS. 9 and 10 may be replaced with the collector region 22.

While the embodiments of the present invention have been described, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
a semiconductor substrate having bulk donors distributed throughout the semiconductor substrate;

a high-concentration hydrogen peak provided on the semiconductor substrate and having a hydrogen dose amount of $3\times10^{15}/cm^2$ or more;
a high-concentration region including a position overlapping with the high-concentration hydrogen peak in a depth direction of the semiconductor substrate and having a donor concentration higher than a bulk donor concentration; and
a lifetime adjustment portion provided at a position overlapping with the high-concentration hydrogen peak in the depth direction and having a carrier lifetime indicating a minimum value.

2. The semiconductor device according to claim 1, wherein
a hydrogen dose amount of the high-concentration hydrogen peak is $1\times10^{16}/cm^2$ or more.

3. The semiconductor device according to claim 1, wherein
a hydrogen chemical concentration of the high-concentration hydrogen peak is $2\times10^{18}/cm^3$ or more.

4. The semiconductor device according to claim 1, wherein
a carrier density distribution of the high-concentration region in the depth direction includes a valley arranged at a position overlapping with the high-concentration hydrogen peak and a peak arranged adjacent to the valley.

5. The semiconductor device according to claim 1, wherein
a plurality of the high-concentration hydrogen peaks are provided at different positions in the depth direction.

6. The semiconductor device according to claim 1, wherein
a carrier density within a full width at half maximum of the high-concentration hydrogen peak in the depth direction has a valley or a kink.

7. The semiconductor device according to claim 1, wherein
a local maximum of a carrier density peak is arranged at a position different from a local maximum of the high-concentration hydrogen peak.

8. The semiconductor device according to claim 1, further comprising:
a gate structure provided on an upper surface of the semiconductor substrate, wherein
the high-concentration hydrogen peak includes a lower tail in which a hydrogen chemical concentration decreases toward a lower surface of the semiconductor substrate and an upper tail in which the hydrogen chemical concentration decreases more steeply toward the upper surface of the semiconductor substrate than the lower tail.

9. The semiconductor device according to claim 8, wherein
the high-concentration hydrogen peak is arranged in a region on a lower surface side of the semiconductor substrate.

10. The semiconductor device according to claim 8, further comprising:
a trench portion provided on the upper surface of the semiconductor substrate, wherein
the semiconductor substrate has a critical depth position where an integrated value obtained by integrating a donor concentration from a lower end of the trench portion toward the lower surface of the semiconductor substrate reaches a critical integrated concentration of the semiconductor substrate, and a local maximum of the high-concentration hydrogen peak is arranged closer to the lower surface side of the semiconductor substrate than the critical depth position.

11. The semiconductor device according to claim 8, wherein a vacancy density distribution in the depth direction has:

a vacancy density peak arranged to overlap with the high-concentration hydrogen peak in the depth direction;

a lower flat portion arranged closer to the lower surface of the semiconductor substrate than the vacancy density peak; and an upper flat portion arranged closer to the upper surface of the semiconductor substrate than the vacancy density peak and having a lower density than the lower flat portion.

12. The semiconductor device according to claim 11, wherein a full width at half maximum of the vacancy density peak in the depth direction is smaller than a full width at half maximum of the high-concentration hydrogen peak in the depth direction.

13. The semiconductor device according to claim 8, further comprising:

an upper surface side donor peak arranged closer to the upper surface side of the semiconductor substrate than the high-concentration hydrogen peak and having a donor concentration indicating a peak; and a low-concentration hydrogen peak provided at a position overlapping with the upper surface side donor peak in the depth direction and having a hydrogen dose amount of smaller than $3\times10^{15}/cm^2$.

14. The semiconductor device according to claim 13, wherein a carrier lifetime within a full width at half maximum of the low-concentration hydrogen peak in the depth direction does not have a minimum value.

15. The semiconductor device according to claim 13, wherein a ratio of a vacancy concentration to a concentration of the low-concentration hydrogen peak at a depth position where the low-concentration hydrogen peak is provided is smaller than a ratio of a vacancy concentration to a concentration of the high-concentration hydrogen peak at a depth position where the high-concentration hydrogen peak is provided.

16. The semiconductor device according to claim 13, wherein a range of a full width at half maximum of the high-concentration hydrogen peak and a range of the full width at half maximum of the low-concentration hydrogen peak are separated from each other.

17. The semiconductor device according to claim 8, further comprising:

a collector region provided in contact with the lower surface of the semiconductor substrate and having an acceptor concentration peak; and a range of a full width at half maximum of the acceptor concentration peak and the range of the full width at half maximum of the high-concentration hydrogen peak are separated from each other.

18. The semiconductor device according to claim 2, wherein a hydrogen chemical concentration of the high-concentration hydrogen peak is $2\times10^{18}/cm^3$ or more.

19. The semiconductor device according to claim 2, wherein a carrier density distribution of the high-concentration region in the depth direction includes a valley arranged at a position overlapping with the high-concentration hydrogen peak and a peak arranged adjacent to the valley.

20. The semiconductor device according to claim 3, wherein a carrier density distribution of the high-concentration region in the depth direction includes a valley arranged at a position overlapping with the high-concentration hydrogen peak and a peak arranged adjacent to the valley.

* * * * *